United States Patent
Uezato (10) Patent No.: US 11,901,272 B2
(45) Date of Patent: Feb. 13, 2024

(54) SEMICONDUCTOR MODULE

(71) Applicant: FUJI ELECTRIC CO., LTD., Kawasaki (JP)

(72) Inventor: Yoshinori Uezato, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 96 days.

(21) Appl. No.: 17/134,857

(22) Filed: Dec. 28, 2020

(65) Prior Publication Data
US 2021/0257284 A1 Aug. 19, 2021

(30) Foreign Application Priority Data

Feb. 14, 2020 (JP) .................................. 2020-023585

(51) Int. Cl.
*H01L 23/498* (2006.01)
*H01L 23/15* (2006.01)
*H01L 23/373* (2006.01)

(52) U.S. Cl.
CPC ........ *H01L 23/49811* (2013.01); *H01L 23/15* (2013.01); *H01L 23/3735* (2013.01); *H01L 23/49822* (2013.01); *H01L 23/49838* (2013.01); *H01L 23/49861* (2013.01)

(58) Field of Classification Search
CPC ............... H01L 23/49811; H01L 23/15; H01L 23/3735; H01L 23/49822; H01L 23/49838; H01L 23/49861
See application file for complete search history.

(56) References Cited

U.S. PATENT DOCUMENTS

| | | | | |
|---|---|---|---|---|
| 6,507,112 | B1 * | 1/2003 | Kurihara | ................. H01L 24/03 438/614 |
| 9,617,455 | B2 * | 4/2017 | Higashidate | ......... C09D 183/08 |
| 2010/0052149 | A1 * | 3/2010 | Nose | ................. H01L 23/49513 257/692 |
| 2011/0012243 | A1 * | 1/2011 | Sahasrabudhe | ... H01L 23/49503 257/676 |
| 2012/0306087 | A1 * | 12/2012 | Bayerer | ................. H01L 24/05 257/772 |

(Continued)

FOREIGN PATENT DOCUMENTS

| | | |
|---|---|---|
| JP | H10-84059 A | 3/1998 |
| JP | 2012064855 A | 3/2012 |

(Continued)

OTHER PUBLICATIONS

Japanese Patent Office Action dated Nov. 21, 2023, for corresponding Japanese Patent Application No. 2020-023585.

*Primary Examiner* — Eugene Lee
(74) *Attorney, Agent, or Firm* — Rabin & Berdo, P.C.

(57) ABSTRACT

A semiconductor module includes a ceramic board, a circuit pattern metal plate on a principal surface of the ceramic board, and an external connection terminal including a bonding portion and a conductive portion. The metal plate includes a bonding area at a first surface thereof, and a stress relaxation portion disposed within the bonding area. The bonding portion has a bonding surface, and an edge that is located at a position overlapping an area in which the stress relaxation portion is disposed in a plan view. A solder is disposed between the bonding surface and the bonding area, to bond the external connection terminal to the circuit pattern metal plate.

11 Claims, 6 Drawing Sheets

(56) References Cited

U.S. PATENT DOCUMENTS

| | | | |
|---|---|---|---|
| 2015/0380374 A1* | 12/2015 | Nakamura | H01L 24/01 |
| | | | 361/783 |
| 2016/0093594 A1 | 3/2016 | Funatsu et al. | |
| 2016/0126209 A1* | 5/2016 | Hinata | H01L 23/49811 |
| | | | 257/784 |
| 2018/0114765 A1* | 4/2018 | Tanisawa | H01L 24/85 |
| 2018/0174987 A1* | 6/2018 | Chounabayashi | H01L 24/01 |
| 2020/0135682 A1* | 4/2020 | Ishikawa | H01L 21/52 |
| 2021/0066236 A1* | 3/2021 | Oomori | H01L 24/48 |

FOREIGN PATENT DOCUMENTS

| | | |
|---|---|---|
| JP | 2016-072417 A | 5/2016 |
| JP | 2017079258 A | 4/2017 |

* cited by examiner

SEMICONDUCTOR MODULE

CROSS-REFERENCE TO RELATED APPLICATION

This application is based upon and claims the benefit of priority of the prior Japanese Patent Application No. 2020-023585, filed on Feb. 14, 2020, the entire contents of which are incorporated herein by reference.

BACKGROUND OF THE INVENTION

1. Field of the Invention

The embodiments discussed herein relate to a semiconductor module having external connection terminals (lead frame) electrically connected to a power semiconductor element.

2. Background of the Related Art

Semiconductor modules are used in power converters such as motor drive inverter units. A semiconductor module includes an insulating substrate having a ceramic board over whose both principal planes a circuit pattern metal plate and a radiation plate, respectively, are formed, a power semiconductor element and an external connection terminal mounted over the circuit pattern metal plate, a base plate bonded to the radiation plate, and a case. An insulated gate bipolar transistor (IGBT) and a freewheeling diode (FWD) or a metal-oxide-semiconductor field-effect transistor (MOSFET) is used as the power semiconductor element.

The power semiconductor element and the external connection terminal are bonded to the circuit pattern metal plate mainly by soldering with productivity taken into consideration. When the external connection terminal is bonded to the circuit pattern metal plate, a sufficient amount of solder is supplied between the external connection terminal and the circuit pattern metal plate in order to prevent an electrical connection between the external connection terminal and the circuit pattern metal plate from being broken.

With this semiconductor module a heat cycle is performed because heat is generated by the power semiconductor element at the time of the operation of the semiconductor module. Accordingly, a thermal stress caused by the expansion and contraction of the solder and the circuit pattern metal plate is applied to a portion of the ceramic board over which the external connection terminal is mounted. The linear expansion coefficient of the solder is higher than that of the circuit pattern metal plate and the volume of the solder is great. This increases a thermal stress applied to the ceramic board. Furthermore, when a thermal deformation of the base plate occurs due to heat generated by the power semiconductor element, the case also deforms. As a result, a compressive stress and a tensile stress are applied from the case to the external connection terminal fixed to the case. Accordingly, a stress concentrates on a peripheral edge portion of the circuit pattern metal plate over which the external connection terminal is mounted. As a result, a crack appears in a portion of the ceramic board where a stress concentrates and the risk of a dielectric breakdown increases.

Formerly the formation of a plurality of dimples in an outer peripheral portion of a circuit pattern metal plate over which a terminal portion is mounted was proposed as a means to relax a stress applied from the circuit pattern metal plate to a ceramic board (see, for example, Japanese Laid-open Patent Publication No. 2016-072417 (FIG. 10)). Furthermore, forming a groove or a hole in a circuit pattern metal plate around a semiconductor element to prevent a solder from spreading was proposed as a means to relax a stress applied to a ceramic board and caused by a solder (see, for example, Japanese Laid-open Patent Publication No. 10-084059 (FIGS. 1, 2, and 10)).

With the technique disclosed in, for example, Japanese Laid-open Patent Publication No. 2016-072417 or Japanese Laid-open Patent Publication No. 10-084059, an area of the circuit pattern metal plate is needed for forming the dimples or the groove or the hole around the terminal portion or the semiconductor element. As a result, a mounting area increases. This leads to an increase in the size of a semiconductor module.

SUMMARY OF THE INVENTION

According to an aspect, there is provided a semiconductor module including a ceramic board having a principal surface; a circuit pattern metal plate disposed on the principal surface of the ceramic board, the circuit pattern metal plate having a first surface and a second surface opposite to the first surface and facing the principal surface of the ceramic board, the circuit pattern metal plate including a bonding area at the first surface, and a stress relaxation portion disposed within the bonding area at the first surface; and an external connection terminal, including a bonding portion having a bonding surface, the bonding portion having an edge that is located at a position overlapping an area in which the stress relaxation portion is disposed in a plan view of the semiconductor module, and a conductive portion connected to the bonded portion; and a solder disposed between the bonding surface and the bonding area, to bond the external connection terminal to the circuit pattern metal plate.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Embodiments will now be described in detail by reference to the accompanying drawings. In the drawings, components marked with the same numerals are the same. Furthermore, more than one embodiment may partially be combined and implemented as long as there is no contradiction.

First Embodiment

Figure 1:
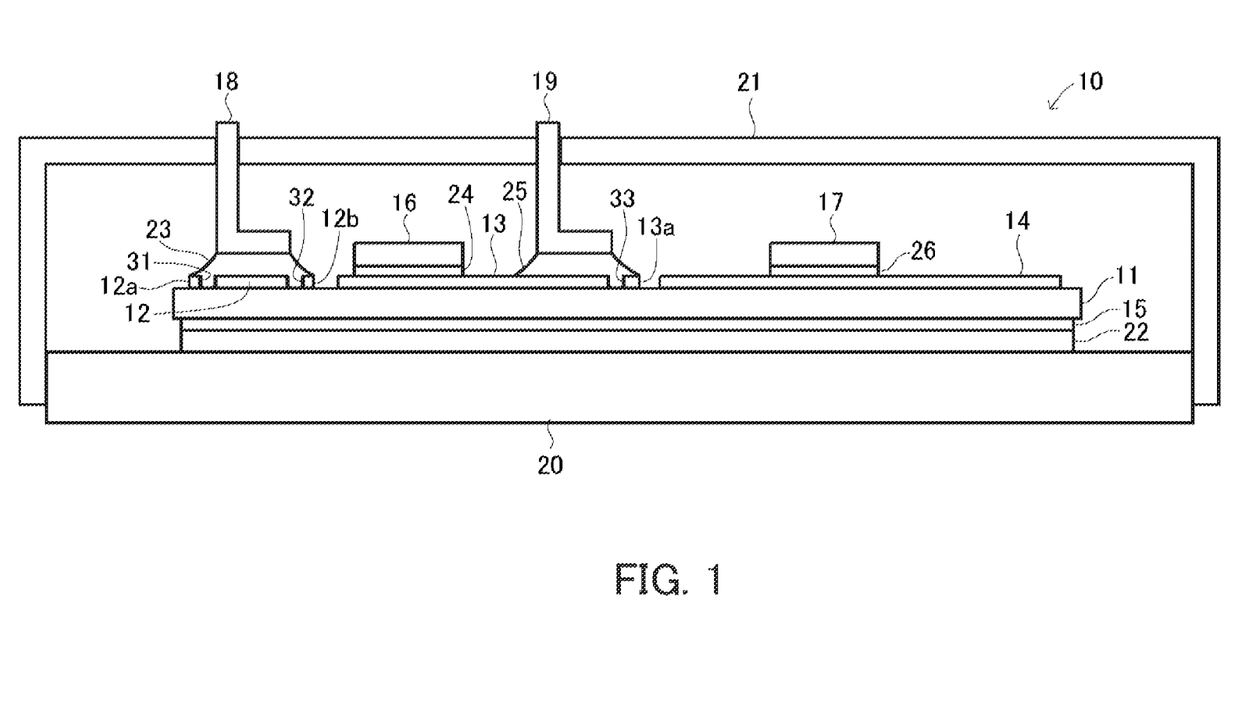
FIG. 1 is a sectional view of a semiconductor module according to a first embodiment.
Figure 2:
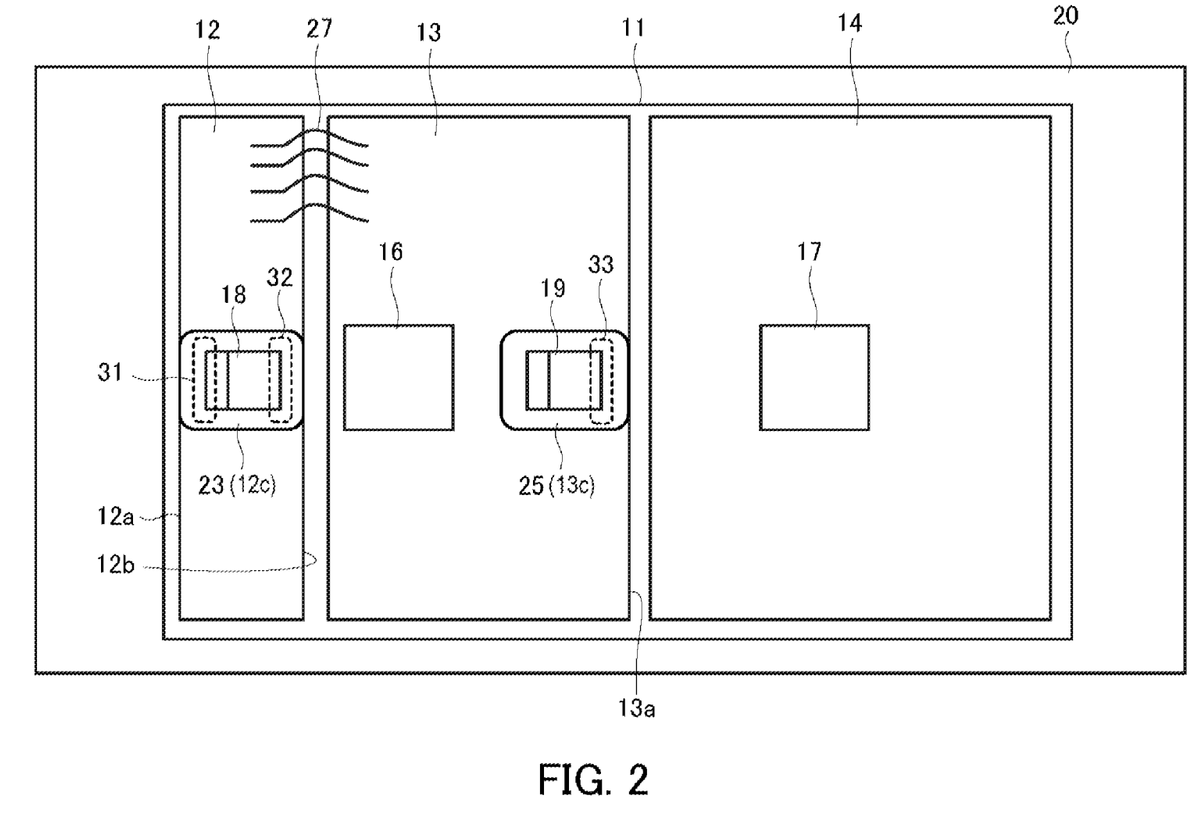
FIG. 2 is a plan view illustrative of the inside of the semiconductor module according to the first embodiment.
Figure 3:
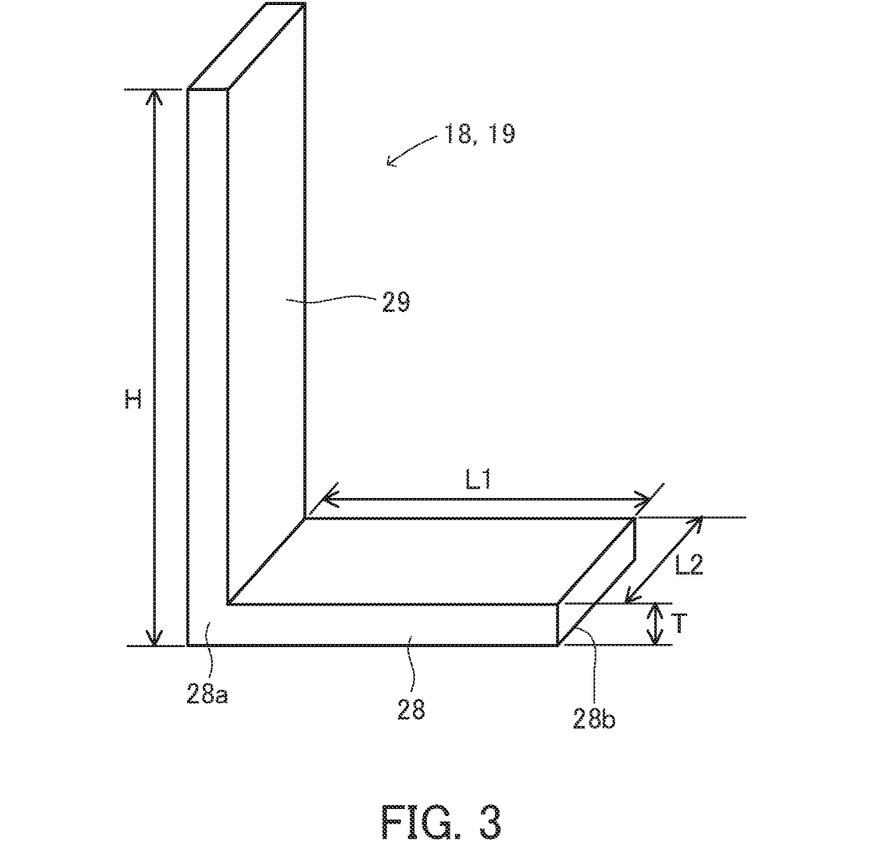
FIG. 3 is a perspective view of an example of an external connection terminal.
Figure 4:
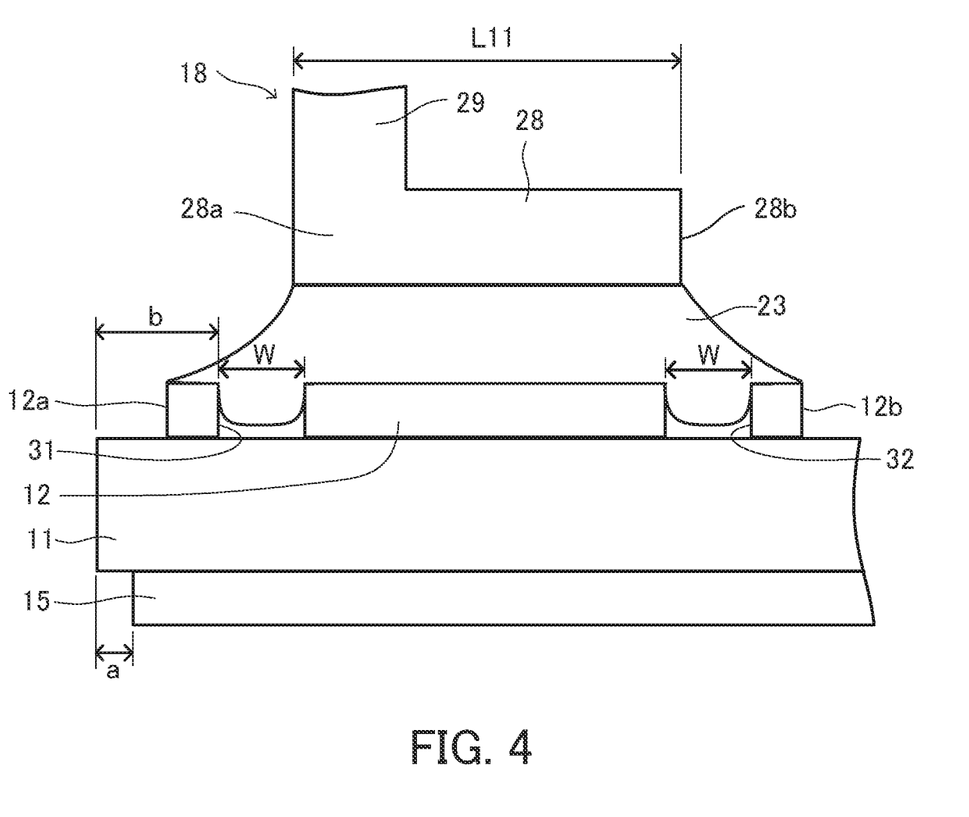
FIG. 4 is a sectional view for describing a stress relaxation portion formed in a circuit pattern metal plate.

FIG. 1 is a sectional view of a semiconductor module according to a first embodiment. FIG. 2 is a plan view illustrative of the inside of the semiconductor module according to the first embodiment. FIG. 3 is a perspective view of an example of an external connection terminal. FIG. 4 is a sectional view for describing a stress relaxation portion formed in a circuit pattern metal plate. The external connection terminal or a case is not illustrated in FIG. 2.

A semiconductor module 10 according to a first embodiment includes a ceramic board 11, circuit pattern metal plates 12, 13, and 14, a radiation plate 15, semiconductor elements 16 and 17, external connection terminals 18 and 19, a base plate 20, and a case 21.

The semiconductor elements 16 and 17 are power semiconductor elements. Switching elements, such as IGBTs or MOSFETs, or FWDs are used as the semiconductor elements 16 and 17. Furthermore, reverse-conducting (RC)-IGBTs obtained by integrally forming a switching element and a diode may be used as the semiconductor elements 16 and 17. The semiconductor elements 16 and 17 are made of silicon (Si) or silicon carbide (SiC).

The ceramic board 11, the circuit pattern metal plates 12, 13, and 14, and the radiation plate 15 make up an insulating substrate. The circuit pattern metal plates 12, 13, and 14 are formed over one principal plane of the ceramic board 11. The radiation plate 15 is formed over the whole of the other principal plane of the ceramic board 11 and is bonded to the base plate 20 with a solder 22.

The thickness of the ceramic board 11 is greater than or equal to 0.2 mm and smaller than or equal to 1.2 mm. If the ceramic board 11 is too thin, then a crack may appear in the ceramic board 11 due to bending stress or impact and cause damage to the ceramic board 11. If the ceramic board 11 is too thick, then dissipation of heat generated by a semiconductor element is suppressed and the semiconductor element may be damaged. The thickness of the circuit pattern metal plates 12, 13, and 14 and the radiation plate 15 is greater than or equal to 0.1 mm and smaller than or equal to 1.2 mm. The ceramic board 11 is made of a ceramic having an insulating property. Alumina ($Al_2O_3$), silicon nitride ($Si_3N_4$), aluminum nitride (AlN), or the like is used as a material.

The circuit pattern metal plates 12, 13, and 14 and the radiation plate 15 formed over the ceramic board 11 are made of metal, such as copper (Cu), a copper alloy, aluminum (Al), or an aluminum alloy, having high electrical conductivity and high thermal conductivity. The surfaces of the circuit pattern metal plates 12, 13, and 14 may be uncoated or coated. In the latter case, the surfaces of the circuit pattern metal plates 12, 13, and 14 are coated with nickel (Ni)-based metal, gold (Au)-based metal or silver (Ag)-based metal. The base plate 20 is made of metal, such as copper, a copper alloy, aluminum, or an aluminum alloy, having high thermal conductivity.

The external connection terminal 18 is bonded to the circuit pattern metal plate 12 with a solder 23. As illustrated in FIG. 2, a bonding area (12c) of the solder 23 is between two edge portions 12a and 12b opposite each other of the perimeter of the circuit pattern metal plate 12 and is in contact with the edge portions 12a and 12b. That is to say, the bonding area of the solder 23 reaches the edge portions 12a and 12b of the circuit pattern metal plate 12 in the direction of the short sides of the circuit pattern metal plate 12 (in the horizontal direction in FIG. 1 and FIG. 2). The semiconductor element 16 is bonded to the circuit pattern metal plate 13 with a solder 24 and the external connection terminal 19 is bonded to the circuit pattern metal plate 13 with a solder 25. As illustrated in FIG. 2, a bonding area (13c) of the solder 25 with which the external connection terminal 19 is bonded to the circuit pattern metal plate 13 reaches an edge portion 13a of the perimeter of the circuit pattern metal plate 13. The semiconductor element 17 is bonded to the circuit pattern metal plate 14 with a solder 26. With the semiconductor module 10 illustrated in FIG. 2, the circuit pattern metal plates 12 and 13 are electrically connected by bonding wires 27.

The base of the solders 23 through 26 is a Pb-free solder. The solders 24 and 26 with which the semiconductor elements 16 and 17 are bonded to the circuit pattern metal plates 13 and 14 respectively are made of a material for which a void is hardly generated and which has high temperature resistance. For example, an alloy-based solder containing tin and antimony (Sn—Sb) as the main ingredients is used. The solders 23 and 25 with which the external connection terminals 18 and 19 are bonded to the circuit pattern metal plates 12 and 13 respectively are made of a material having good wettability with the external connection terminals 18 and 19 respectively. For example, an alloy-based solder containing tin and silver (Sn—Ag) as the main ingredients is used. Furthermore, the solders 23 through 26 may contain an additive such as copper, bismuth, indium, nickel, germanium, cobalt, or silicon.

As illustrated in FIG. 3, the external connection terminals 18 and 19 are bent members having the shape of the letter "L." The external connection terminal 18 includes a bonding portion 28 bonded to the circuit pattern metal plate 12 with the solder 23 and a conductive portion 29 electrically connected to the outside. The external connection terminal 19 includes a bonding portion 28 bonded to the circuit pattern metal plate 13 with the solder 25 and a conductive portion 29 electrically connected to the outside. The conductive portions 29 extend from the bonding portions 28 in a direction opposite to solder bonding surfaces of the bonding portions 28. The conductive portions 29 preferably extend from the bonding portions 28 perpendicularly to the solder bonding surfaces of the bonding portions 28. The bonding portions 28 are connected to the conductive portions 29 by bent portions 28a and the sides opposite to the bent portions 28a form end portions 28b of the external connection terminals 18 and 19.

The external connection terminal 18 is located with the bent portion 28a by which the bonding portion 28 is connected to the conductive portion 29 on the side of the edge portion 12a of the circuit pattern metal plate 12 and the end portion 28b on the side of the edge portion 12b of the circuit pattern metal plate 12. The external connection terminal 19 is located with the end portion 28b on the side of the edge portion 13a of the circuit pattern metal plate 13. The directions of the bent portions 28a and the end portions 28b at the time of locating the external connection terminals 18 and 19 over the circuit pattern metal plates 12 and 13 respectively are not limited to those illustrated in FIG. 1 or 2. With the external connection terminal 18 or 19, however, at least one of the four sides of the bonding portion 28 need only be parallel to and close to the edge portion 12a or 12b of the circuit pattern metal plate 12 or the edge portion 13a of the circuit pattern metal plate 13.

The dimensions of the external connection terminals 18 and 19 are as follows. The length L1 of the bonding portions 28 extending from the conductive portions 29 is 1 to 5 mm.

The length L2 of the sides of the bonding portions 28 opposite to the bent portions 28a is 1 to 6 mm. The thickness T of the bonding portions 28 is 0.5 to 1.5 mm. The height H of the conductive portions 29 is 4 to 35 mm. The length L1 and the length L2 are greater than or equal to the thickness T. Furthermore, the thickness T of the bonding portions 28 is smaller than or equal to the thickness of the conductive portions 29. With the external connection terminals 18 and 19 in this embodiment, the length L1 of the bonding portions 28 is 3.0 mm, the length L2 is 1.1 mm, the thickness T is 1.0 mm, and the height H of the conductive portions 29 is 32 mm. A material for the external connection terminals 18 and 19 is copper or a copper alloy.

As illustrated in FIGS. 1 and 2, slits 31, 32, and 33 which function as stress relaxation portions are formed just under edges of the bonding portions 28 of the external connection terminals 18 and 19 on the sides of the edge portions 12a and 12b of the circuit pattern metal plate 12 and the edge portion 13a of the circuit pattern metal plate 13 respectively.

As illustrated in FIGS. 2 and 4, the solder 23 is located between the external connection terminal 18 and the circuit pattern metal plate 12. The solder 23 reaches the edge portions 12a and 12b of the circuit pattern metal plate 12. The slit 31 is located on the side of the edge portion 12a of the circuit pattern metal plate 12 and the slit 32 is located on the side of the edge portion 12b of the circuit pattern metal plate 12. In this case, the side of the edge portion 12a or 12b of the circuit pattern metal plate 12 is an area extending from the edge portion 12a or 12b which the solder 23 reaches to a straight line just under the external connection terminal 18. Similarly, the solder 25 is also located between the external connection terminal 19 and the circuit pattern metal plate 13. The solder 25 reaches the edge portion 13a of the circuit pattern metal plate 13. The slit 33 is located on the side of the edge portion 13a of the circuit pattern metal plate 13. In this case, the side of the edge portion 13a of the circuit pattern metal plate 13 is an area extending from the edge portion 13a which the solder 25 reaches to a straight line just under the external connection terminal 19.

The slits 31 and 32 pierce the circuit pattern metal plate 12 from the front surface to which the external connection terminal 18 is bonded to the back surface to which the ceramic board 11 is bonded. The slit 33 pierces the circuit pattern metal plate 13 from the front surface to which the external connection terminal 19 is bonded to the back surface to which the ceramic board 11 is bonded. The width of the slits 31 and 32 may be uniform from the front surface to the back surface of the circuit pattern metal plate 12. Furthermore, the slits 31, 32, and 33 are rectangular in planar view and may have rounded corner portions.

The slit 31 is formed inside the edge portion 12a of the circuit pattern metal plate 12 along the edge portion 12a at a constant distance from the edge portion 12a. The slit 32 is formed inside the edge portion 12b of the circuit pattern metal plate 12 along the edge portion 12b at a constant distance from the edge portion 12b. To be concrete, the slit 31 is formed parallel to the edge portion 12a in the circuit pattern metal plate 12 just under the outer corner portion of the bent portion 28a of the external connection terminal 18. The slit 32 is formed parallel to the edge portion 12b in the circuit pattern metal plate 12 just under the end portion 28b of the external connection terminal 18. The circuit pattern metal plate 12 is situated in an area between the slits 31 and 32 just under the bonding portion 28 of the external connection terminal 18. Accordingly, the slits 31 and 32 are formed in positions opposite each other on the sides of the edge portions 12a and 12b, respectively, of the circuit pattern metal plate 12 with the external connection terminal 18 therebetween.

The slit 33 is formed inside the edge portion 13a of the circuit pattern metal plate 13 along the edge portion 13a at a constant distance from the edge portion 13a. Furthermore, the slit 33 is formed parallel to the edge portion 13a in the circuit pattern metal plate 13 just under the end portion 28b of the external connection terminal 19. The circuit pattern metal plate 13 is situated inside the slit 33 just under the bonding portion 28 of the external connection terminal 19.

The slits 31 and 32 are formed in the circuit pattern metal plate 12 just under the external connection terminal 18 and the slit 33 is formed in the circuit pattern metal plate 13 just under the external connection terminal 19. However, the width W of the slits 31, 32, and 33 is not capable of being made large because there is a need to ensure a path of a current flowing through the circuit pattern metal plates 12 and 13 just under the external connection terminals 18 and 19. In particular, with the circuit pattern metal plate 12 over which the external connection terminal 18 is located so as to cross an area between both the edge portions 12a and 12b, as illustrated in FIG. 4, the area of the circuit pattern metal plate 12 between the slits 31 and 32 is a path of a current. In this case, it is assumed that the length L11 of a side of the bonding portion 28, i.e., a length of the bonding surface of the bonding portion 28, of the external connection terminal 18 extending in a direction (second direction) perpendicular to a direction (first direction) of the edge portion 12a of the circuit pattern metal plate 12 is 1. Then it is desirable that the width W in the second direction of the slits 31 and 32 fall within the range of 0.1 to 0.3. This constraint is not imposed on the slit 33 formed in the circuit pattern metal plate 13 just under the external connection terminal 19. However, the width of the slit 33 is made equal to that of the slits 31 and 32. In this embodiment the slits 31, 32, and 33 have a rectangular shape in planar view. However, the slits 31, 32, and 33 may have an oval or elliptical shape in planar view.

The solder 23 with which the external connection terminal 18 is bonded to the circuit pattern metal plate 12 is formed at least between the underside of the bonding portion 28 of the external connection terminal 18 and the front surface of the circuit pattern metal plate 12 and inside the slits 31 and 32. Furthermore, the solder 23 may reach the edge portions 12a and 12b on the front surface of the circuit pattern metal plate 12. In addition, the solder 25 with which the external connection terminal 19 is bonded to the circuit pattern metal plate 13 is formed at least between the underside of the bonding portion 28 of the external connection terminal 19 and the front surface of the circuit pattern metal plate 13 and inside the slit 33. Moreover, the solder 25 may reach the edge portion 13a on the side of the end portion 28b of the external connection terminal 19 on the front surface of the circuit pattern metal plate 13.

The solder 23 with which the external connection terminal 18 is bonded to the circuit pattern metal plate 12 partially flows into the slits 31 and 32. The solder 25 with which the external connection terminal 19 is bonded to the circuit pattern metal plate 13 partially flows into the slit 33. As illustrated in FIG. 4, the solder 23 is formed on the front surface of the circuit pattern metal plate 12 and inside the slits 31 and 32 from the front surface side to a way portion and does not reach the ceramic board 11. That is to say, the solder 23 is partially embedded in the slits 31 and 32 to have gaps between the solder 23 and the front surface of the circuit pattern metal plate 12. The gaps in the slits 31 and 32 are free of solder 23. This further enhances the effect of the stress relaxation portions.

Furthermore, the position of the slit 31 formed in the circuit pattern metal plate 12 is nearest an edge portion of the ceramic board 11. The position of the slit 31 is determined with the position of the radiation plate 15 formed on the other principal plane of the ceramic board 11 taken into consideration. That is to say, the slit 31 is formed in the circuit pattern metal plate 12 at a distance of b (a<b) from the edge portion of the ceramic board 11 which is longer than the distance a from the edge portion of the ceramic board 11 to an edge portion of the radiation plate 15. By forming the slit 31 inside the edge portion of the radiation plate 15, positions on both surfaces of the ceramic board 11 to which stresses are applied by the circuit pattern metal plate 12 and the radiation plate 15 are decentralized. This further enhances the effect of the stress relaxation portion.

As has been described, the semiconductor module 10 has the function of the stress relaxation portions embedded in the solders 23 and 25 with which the external connection terminals 18 and 19 are bonded to the circuit pattern metal plates 12 and 13 respectively. Accordingly, with the semiconductor module 10 the appearance of a crack in the ceramic board 11 caused by a repeated thermal stress is suppressed and the risk of a dielectric breakdown decreases. Furthermore, if a usage environment is the same, then a low-strength ceramic material may be used for forming the ceramic board 11. Moreover, the function of the stress relaxation portions is located in the circuit pattern metal plates 12 and 13 just under the external connection terminals 18 and 19 respectively. As a result, a new space for adding the function of the stress relaxation portions is not needed and a mounting area does not decrease.

Second Embodiment

Figure 5:
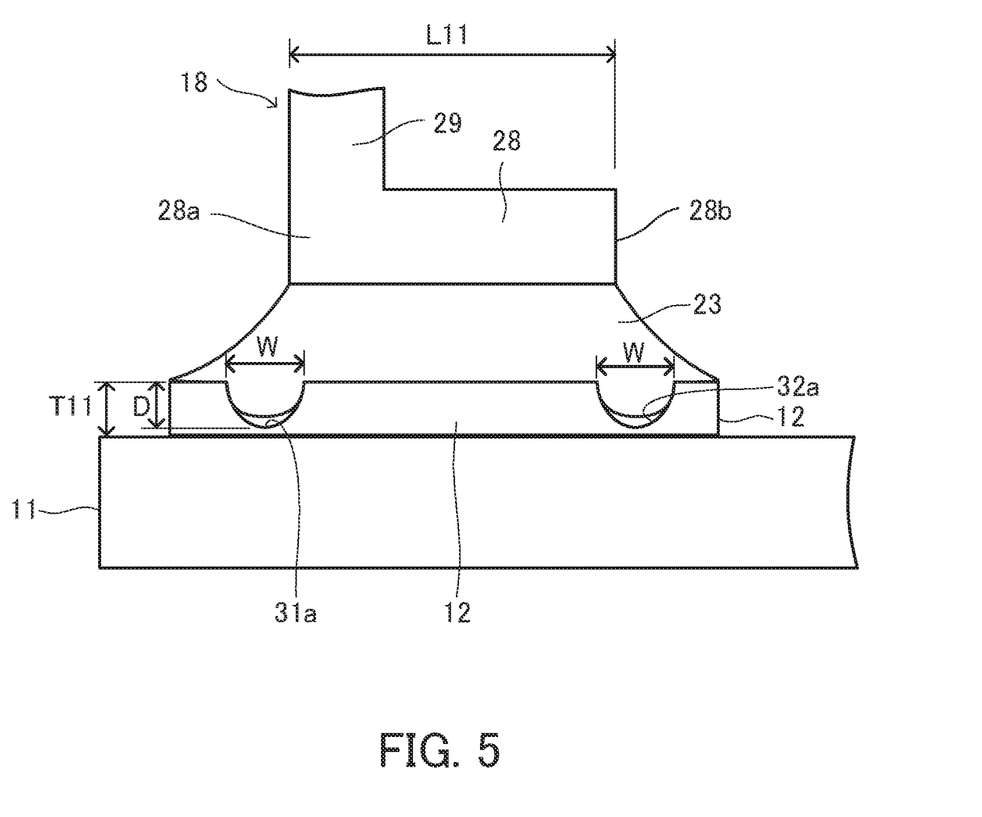
FIG. 5 is a sectional view illustrative of stress relaxation portions in a semiconductor module according to a second embodiment.

FIG. 5 is a sectional view illustrative of stress relaxation portions in a semiconductor module according to a second embodiment. Components in FIG. 5 which are the same as those illustrated in FIG. 4 are marked with the same numerals and detailed descriptions of them will be omitted.

Stress relaxation portions in a semiconductor module according to a second embodiment are grooves 31a and 32a which do not pierce a circuit pattern metal plate 12. It is assumed that the length L11 of a side of a bonding portion 28, i.e., a length of the bonding surface of the bonding portion 28 of an external connection terminal 18 extending in a direction (second direction) perpendicular to a direction (first direction) of an edge portion 12a of the circuit pattern metal plate 12 is 1. Then the width W in the second direction of the grooves 31a and 32a is 0.1 to 0.3. This is the same with the slits 31 and 32.

The grooves 31a and 32a are formed from the front surface of the circuit pattern metal plate 12 to which the external connection terminal 18 is bonded to the back surface of the circuit pattern metal plate 12 to which a ceramic board 11 is bonded. When the thickness T11 of the circuit pattern metal plate 12 is 1, the depth D of the grooves 31a and 32a is 0.5 to 1.0. That when the thickness T11 of the circuit pattern metal plate 12 is 1, the depth D of the grooves 31a and 32a is 1.0 means that the grooves 31a and 32a may partially pierce the circuit pattern metal plates 12. Furthermore, as illustrated in FIG. 5, the width W of the grooves 31a and 32a becomes smaller from the front surface to the back surface of the circuit pattern metal plate 12. A section of each of the grooves 31a and 32a has the shape of the letter "U."

A solder 23 with which the external connection terminal 18 is bonded to the circuit pattern metal plate 12 partially flows into the grooves 31a and 32a. As illustrated in FIG. 5, the solder 23 is formed inside the grooves 31a and 32a but does not reach the bottoms of the grooves 31a and 32a on the ceramic board 11 side. That is to say, the solder 23 is partially embedded in the grooves 31a and 32a to have gaps between the solder 23 and the front surface of the circuit pattern metal plate 12. The gaps in the grooves 31a and 32a are free of the solder 23. This further enhances the effect of the stress relaxation portions.

With the semiconductor module according to the second embodiment the grooves 31a and 32a also function as stress relaxation portions. Accordingly, a stress applied to the ceramic board 11 due to the expansion and contraction of the solder 23 is relaxed. Furthermore, a stress applied via the external connection terminal 18 to the circuit pattern metal plate 12 due to thermal deformation of the whole semiconductor module is relaxed. As a result, the risk of the appearance of a crack in the ceramic board 11 is decreased.

Third Embodiment

Figure 6:
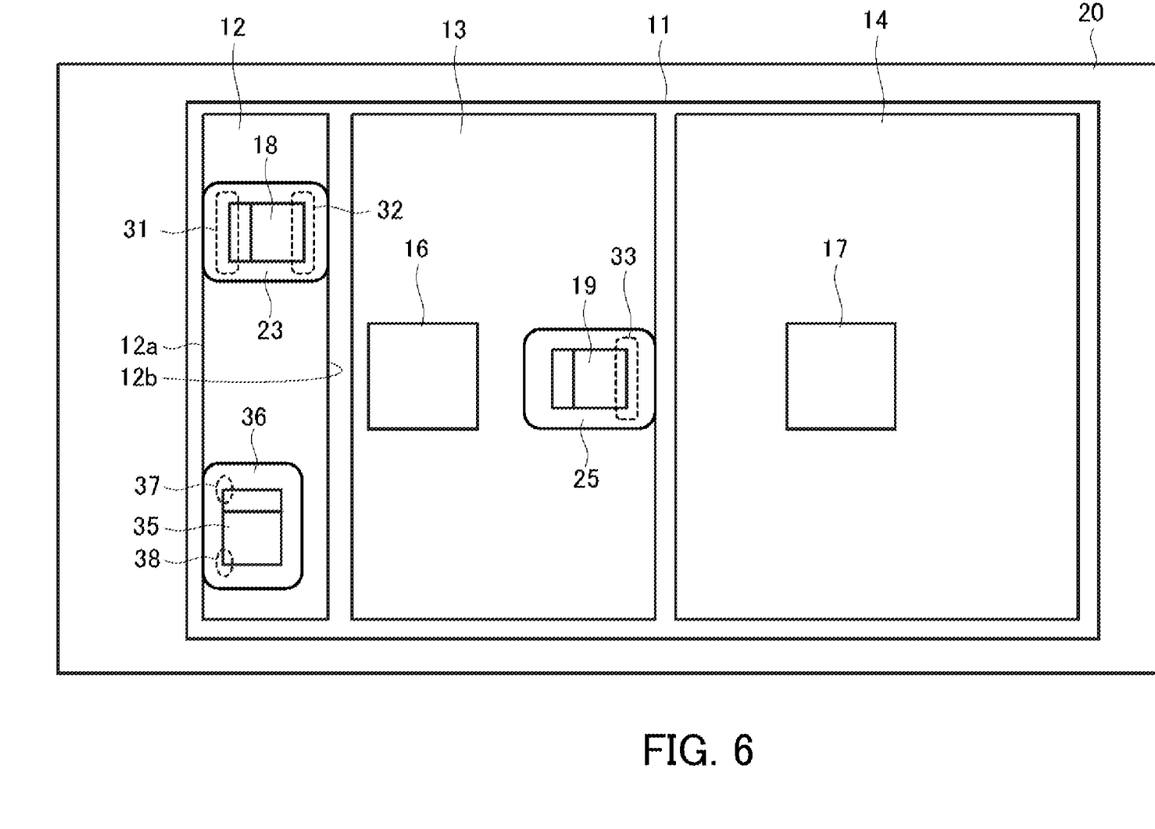
FIG. 6 is a plan view illustrative of the inside of a semiconductor module according to a third embodiment.

FIG. 6 is a plan view illustrative of the inside of a semiconductor module according to a third embodiment. Components in FIG. 6 which are the same as those illustrated in FIG. 2 are marked with the same numerals and detailed descriptions of them will be omitted.

A semiconductor module according to a third embodiment includes an external connection terminal 35 bonded to a circuit pattern metal plate 12 in a different position and direction from an external connection terminal 18. The external connection terminal 35 is bonded to the circuit pattern metal plate 12 with a solder 36 in a state in which it is moved to the side of an edge portion 12a of the circuit pattern metal plate 12 and in which an external connection terminal 18 is rotated by 90 degrees. A stress concentrates just under a bent portion 28a and an end portion 28b of the external connection terminal 35. A stress concentrates just under the edge portion 12a of the circuit pattern metal plate 12. Accordingly, it is effective to form stress relaxation portions in portions at which an area in which a stress concentrates by the external connection terminal 35 and an area in which a stress concentrates by the circuit pattern metal plate 12 overlap.

With this semiconductor module, a slit 37 is formed just under the outer corner portion of the bent portion 28a of the external connection terminal 35 on the side of the edge portion 12a of the circuit pattern metal plate 12 and a slit 38 is formed just under the end portion 28b of the external connection terminal 35 on the side of the edge portion 12a of the circuit pattern metal plate 12. The slit 37 is formed at a position at which the side of a bonding portion 28 of the external connection terminal 35 on the side of the edge portion 12a of the circuit pattern metal plate 12 and the side of the bent portion 28a intersect. By doing so, a stress applied to a ceramic board 11 just under the bonding portion 28 is relaxed. Similarly, the slit 38 is formed at a position at which the side of the bonding portion 28 of the external connection terminal 35 on the side of the edge portion 12a of the circuit pattern metal plate 12 and the side of the end portion 28b intersect. By doing so, a stress applied to the ceramic board 11 just under the bonding portion 28 is relaxed.

With the semiconductor module according to the third embodiment the slits 37 and 38 which have uniform width in cross-sectional view and which pierce the circuit pattern metal plate 12 from the front surface to the back surface are used as stress relaxation portions. However, grooves having the same shape as the grooves 31a and 32a have may be used as stress relaxation portions in place of the slits 37 and 38. Furthermore, the slits 37 and 38 having an elliptical shape in planar view are used as stress relaxation portions. However, even if the slits 37 and 38 having a rectangular, oval, or round shape are used, the same effect is obtained.

As has been described, this semiconductor module has the function of stress relaxation portions in the form of the slits 37 and 38 buried in the solder 36 just under the bent portion 28a and the end portion 28b of the external connection terminal 35 on the side of the edge portion 12a of the circuit pattern metal plate 12. As a result, the semiconductor module relaxes a stress applied to the ceramic board 11 by the solder 36. In addition, the semiconductor module relaxes a stress applied via the external connection terminal 35 to the circuit pattern metal plate 12. Accordingly, the appearance of a crack in the ceramic board 11 is suppressed.

Moreover, with the semiconductor module according to the third embodiment the external connection terminal 35 is mounted over the circuit pattern metal plate 12 so that the bent portion 28a and the end portion 28b will be situated in the longitudinal direction of the long and narrow circuit pattern metal plate 12. However, the slits 37 and 38 are formed only just under part of the sides of the bent portion 28a and the end portion 28b of the external connection terminal 35. Accordingly, the slits 37 and 38 do not block a path of a current flowing through the circuit pattern metal plate 12 in the longitudinal direction.

The semiconductor module having the above structure includes the stress relaxation portions in the circuit pattern metal plate just under the external connection terminal. This relaxes a stress applied to the ceramic board without increasing the mounting area of the circuit pattern metal plate.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor module, comprising:
   a ceramic board having a principal surface;
   a circuit pattern metal plate disposed on the principal surface of the ceramic board, the circuit pattern metal plate having a first surface and a second surface opposite to the first surface and facing the principal surface of the ceramic board, the circuit pattern metal plate including
      a bonding area at said first surface, and
      a stress relaxation portion disposed within the bonding area at said first surface;
   a semiconductor element disposed on the circuit pattern metal plate in a first area;
   an external connection terminal disposed on the circuit pattern metal plate in a second area different from the first area in a plan view of the semiconductor module, the external connection terminal including
      a bonding portion having a bonding surface, the bonding portion having an edge that is located at a position overlapping an area in which the stress relaxation portion is disposed in the plan view, and
      a conductive portion extending upwardly from the bonding portion; and
   a solder disposed between the bonding surface and the bonding area, to bond the external connection terminal to the circuit pattern metal plate, wherein
   a part of the solder is embedded in the circuit pattern metal plate at the stress relaxation portion such that a gap in a thickness direction orthogonal to the principal surface of the ceramic board is formed between the solder and the circuit pattern metal plate at the stress relaxation portion.

2. The semiconductor module according to claim 1, wherein the stress relaxation portion is a slit or a groove formed to extend along an edge of the circuit pattern metal plate.

3. The semiconductor module according to claim 2, wherein
   the circuit pattern metal plate has a rectangular shape with four sides, the slit or groove extending in a first direction parallel to one of the four sides, and having a width in a second direction perpendicular to the first direction,
   the bonding portion of the external connection terminal extends in a direction to have a length parallel to the second direction,
   a ratio of the length of the bonding surface of the bonding portion of the external connection terminal in the second direction to the width of the slit or the groove is in a range of 1:0.1 to 1:0.3.

4. The semiconductor module according to claim 1, wherein the solder disposed between the bonding surface of the bonding portion and the bonding area of the circuit pattern metal plate entirely covers the stress relaxation portion.

5. The semiconductor module according to claim 4, wherein
   the bonding area reaches an edge of the circuit pattern metal plate,
   the stress relaxation portion is located within the bonding area and is apart from the edge of the circuit pattern metal plate, and
   the solder is disposed to entirely cover from the stress relaxation portion to the edge of the circuit pattern metal plate.

6. The semiconductor module according to claim 4, wherein the relaxation portion is a groove in which the part of the solder is partially embedded to have the gap in the thickness direction, the gap being formed between the solder and a bottom of the groove, and being free of the solder.

7. The semiconductor module according to claim 4, wherein the relaxation portion is a slit penetrating from the first surface of the circuit pattern metal plate to reach the principal surface of the ceramic board, the solder being partially embedded in the slit with a gap between the solder and the principal surface of the ceramic board, the gap being free of the solder.

8. The semiconductor module according to claim 1, wherein the external connection terminal is a bent member having an L shape formed by the bonding portion and the conductive portion.

9. The semiconductor module according to claim 8, wherein
- the bonding portion have two opposing sides including a first side and a second side that are parallel to each other,
- the external connection terminal is bonded to the circuit pattern metal plate such that the first side and the second side of the bonding portion are parallel to the edge of the circuit pattern metal plate, the conductive portion extending from the first side of the bonding portion, and
- the stress relaxation portion is disposed in an area that overlaps a position of the first side or the second side of the bonding portion in the plan view.

10. The semiconductor module according to claim 8, wherein:
- the circuit pattern metal plate has two opposing sides that are parallel to each other;
- the stress relaxation portion is provided in plurality; and
- two of the stress relaxation portions are respectively disposed at positions facing each other with the bonding portion of the external connection terminal therebetween in the plan view, and respectively extend along one of the two opposing sides of the circuit pattern metal plate.

11. The semiconductor module according to claim 8, wherein:
- the circuit pattern metal plate has two opposing sides that are parallel to each other;
- the bonding portion of the external connection terminal has a rectangular shape with four sides and four corner portions, and two opposing sides of the four sides of the bonding portion, from one of which the conductive portion extends, are parallel to the two opposing sides of the circuit pattern metal plate;
- the stress relaxation portion is provided in plurality; and
- two of the stress relaxation portions are respectively disposed in areas that respectively overlap two of the four corner portions of the bonding portion in the plan view, the two of the four corner portions being located at two ends of the one side of the bonding portion from which the conductive portion extends.

* * * * *